(12) United States Patent
Yeh

(10) Patent No.: US 9,368,888 B2
(45) Date of Patent: Jun. 14, 2016

(54) ELECTRICAL CONNECTOR WITH A SCREWING MEMBER TO FIX A LOAD PLATE TO A HOUSING

(71) Applicant: FOXCONN INTERCONNECT TECHNOLOGY LIMITED, Grand Cayman (KY)

(72) Inventor: Cheng-Chi Yeh, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/645,785

(22) Filed: Mar. 12, 2015

(65) Prior Publication Data
US 2015/0263441 A1 Sep. 17, 2015

(30) Foreign Application Priority Data

Mar. 12, 2014 (TW) .............................. 103108592 A

(51) Int. Cl.
*H01R 13/62* (2006.01)
*H01R 12/70* (2011.01)
*H05K 7/10* (2006.01)

(52) U.S. Cl.
CPC ........ *H01R 12/7058* (2013.01); *H01R 12/7047* (2013.01); *H01R 13/62* (2013.01); *H05K 7/1007* (2013.01)

(58) Field of Classification Search
CPC ...... H01R 13/62; H01R 13/641; H01R 12/70; H01R 4/50; H01R 12/7058
USPC .......................... 439/331, 345, 366
See application file for complete search history.

(56) References Cited

U.S. PATENT DOCUMENTS

| | | | | |
|---|---|---|---|---|
| 4,033,663 A * | 7/1977 | McCardell | ............... | H01R 4/34 248/27.3 |
| 4,085,989 A * | 4/1978 | McCardell | ............... | H01R 4/34 439/595 |
| 4,165,910 A * | 8/1979 | Anderson | ............ | H01R 13/625 439/318 |
| 4,497,530 A * | 2/1985 | Shannon | .............. | H01R 13/622 439/312 |
| 5,344,334 A * | 9/1994 | Laub | .................... | H05K 7/1061 439/331 |
| 6,010,348 A * | 1/2000 | Alden | .................. | H01R 13/506 439/274 |
| 6,354,859 B1 * | 3/2002 | Barabi | ................ | G01R 1/0483 257/E23.078 |
| 8,979,565 B2 * | 3/2015 | Yeh | ........................ | H01R 12/88 439/331 |
| 2008/0153337 A1 * | 6/2008 | Jin | ..................... | H01R 12/7076 439/331 |

FOREIGN PATENT DOCUMENTS

TW M344587 11/2008

* cited by examiner

*Primary Examiner* — Chandrika Prasad
(74) *Attorney, Agent, or Firm* — Wei Te Chung; Ming Chieh Chang

(57) ABSTRACT

An electrical connector (100) includes an insulating housing (5) with a plurality of contacts received therein, a load plate (1) covering on the insulating housing (5) and a screwing member (2) assembled to the load plate (1). The screwing member (2) includes a head portion (20) with a plurality of tooth portions (201), the load plate (1) includes a tongue portion (12) with a fixing hole (120) for the screwing member (2) going through, a recess (121) near the fixing hole (120) and a block (1210) in the recess (121), during the process of screwing the screwing member (2), the tooth portions (201) touch with the block (1210) for making a sound.

14 Claims, 6 Drawing Sheets

ELECTRICAL CONNECTOR WITH A SCREWING MEMBER TO FIX A LOAD PLATE TO A HOUSING

BACKGROUND OF THE INVENTION

1. Field of the Invention

The present invention relates generally to an electrical connector, and more particularly to an electrical connector having an improved load plate which can indicate a degree of the load plate being screwed onto a printed circuit board (PCB) and then prevents overstress thereby.

2. Description of Related Art

TW patent number M344587 issued to Yeh on Nov. 11, 2008 discloses a traditional socket connector for connecting a package to a substrate. The socket connector comprises an insulating housing with a plurality of contacts received therein, a positioning member near the insulating housing, a metallic cover assembled to the positioning member and covering on the insulating housing and a screw assembled to the metallic cover. The positioning member and the insulating housing are positioned on the substrate. The load plate includes a body portion and a tongue portion extending from the body portion. The tongue portion defines a hole for assembling the screw. After the package is assembled to the insulating housing, rotate the cover to a closed position and then tight the screw to a position where the cover exerts a pressure on the package to make sure that the package stays in the socket securely. However, when tight the screw, there is no any cue to tell the operator that the screw has been tighten to its correct position. If the screw does not achieve its correct position, the load plate can not exert a normal force on the package, which can not ensure the connection between the contacts of the socket connector and the package. While if the screw is over-screwed, the force exerted by the load plate will damage the contacts.

Hence, it is desirable to provide an improved electrical connector to overcome the aforementioned disadvantages.

SUMMARY OF THE INVENTION

Accordingly, an object of the present invention is to provide an electrical connector having an improved load plate can indicate a degree of the load plate being screwed onto a printed circuit board (PCB) and then preventing overstress thereby.

According to one aspect of the present invention, an electrical connector for mounting on a printed circuit board (PCB), includes an insulating housing, a plurality of contacts received in the insulating housing, a load plate covering on the insulating housing and being able to rotate between a closed position and an opened position and a screwing member assembled to the load plate and used to keep the load plate in the closed position, the screwing member includes a head portion with a plurality of tooth portions, the load plate includes a tongue portion, the tongue portion has a fixing hole for the screwing member going through, a recess near the fixing hole and a block in the recess, during the process of screwing the screwing member, the tooth portions touch with the block for making a sound.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
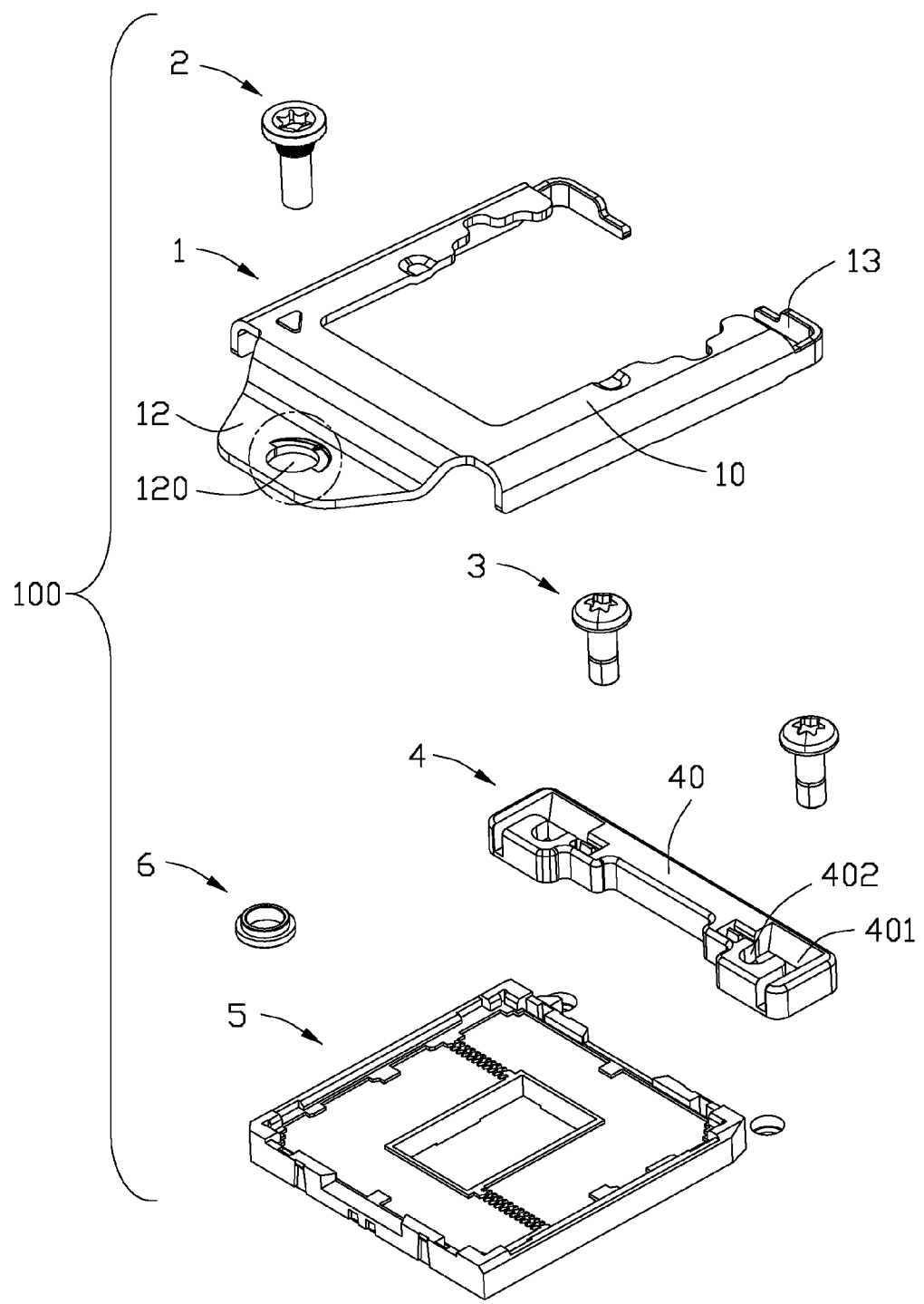
FIG. 1 is an exploded view of an electrical connector according to the present invention.
Figure 4:
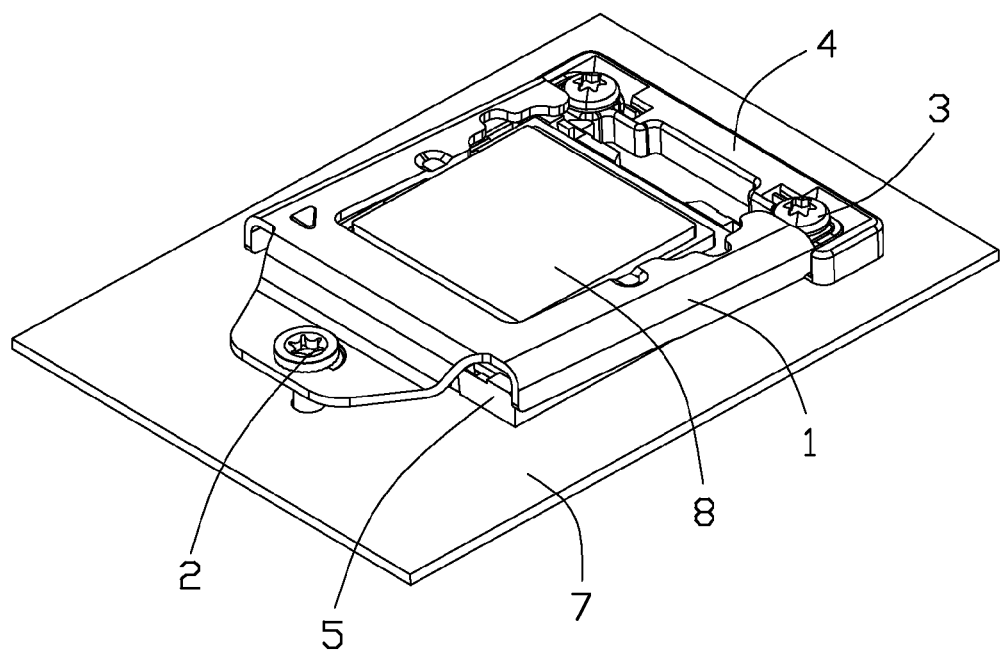
FIG. 4 is an assembled view of the electrical connector and a printed circuit board (PCB)
Figure 5:
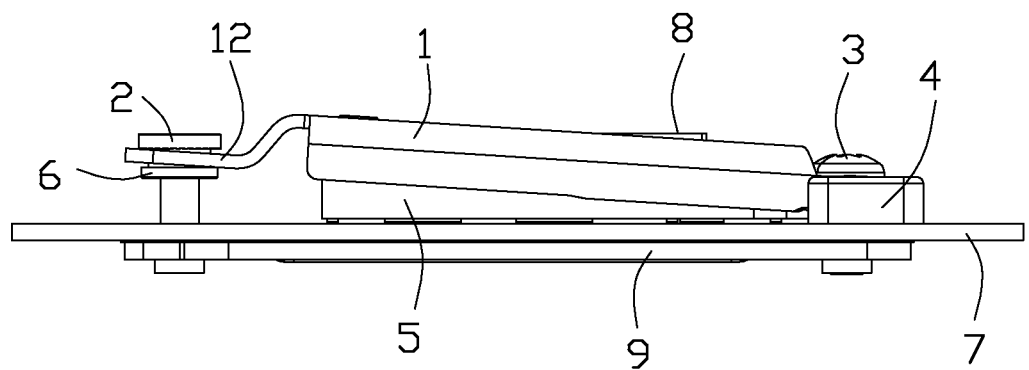
FIG. 5 is side view of the electrical connector and the printed circuit board (PCB) as shown in FIG. 4.
Figure 6:
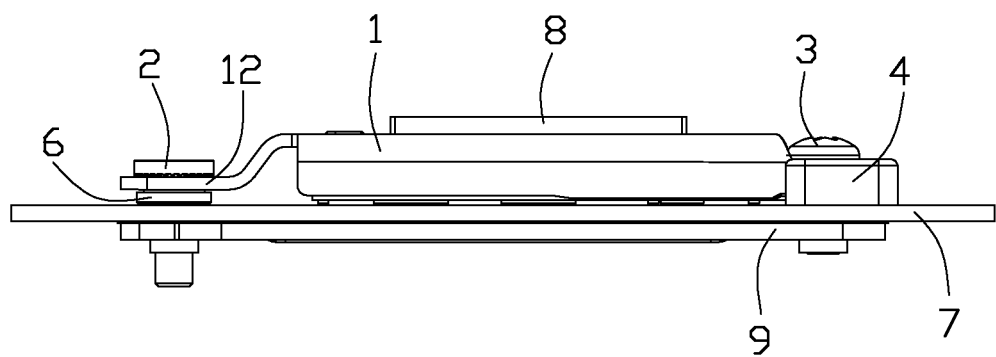
FIG. 6 is similar to FIG. 5, wherein the screw is screwed to a correct position.

Referring to FIGS. 4-6, an electrical connector 100 of the present invention is used for connecting a central processing unit (CPU) 8 with a printed circuit board (PCB) 7. Referring to FIG. 1, the electrical connector 100 comprises an insulating housing 5 with plurality of contacts (not shown) received therein, a fixing member 4 assembled on the PCB 7, a load plate 3 pivotally assembled to the fixing member 4 and covering on the insulating housing 5, a pair of fastening members 3 for assembling the fixing member 4 and the load plate 3 to the PCB 6, a screwing member 2 assembled to the load plate 3 for assembling the load plate 3 to the PCB 6 and a ring 6 assembled to the screwing member 2.

Figure 3:
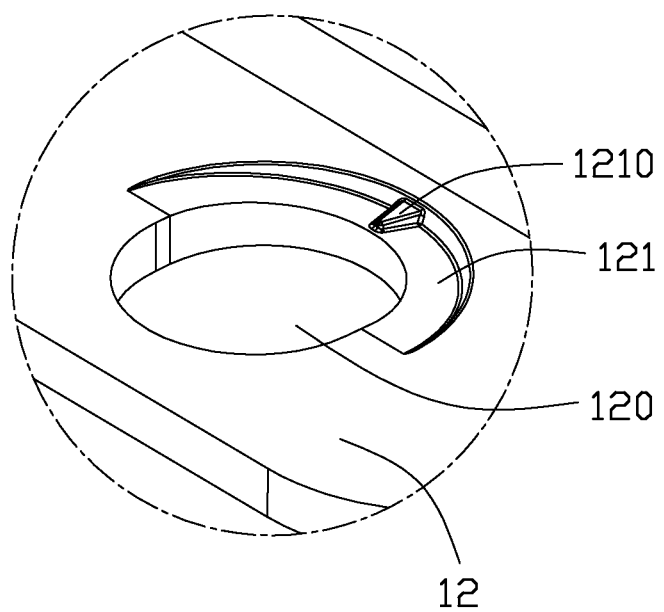
FIG. 3 is an enlarged view of the circular portion of the load plate as shown in FIG. 1.

The load plate 10 has a main portion 10, a tongue portion 12 extending from a front end of the main portion 10, and a pair of pivotal portions 13 extending toward each other from the two opposite ends of the main portion 10. Referring to FIG. 3, the tongue portion 12 defines a through fixing hole 120, a recess 121 near the fixing hole 120 and a block or protrusion 1210 in the recess 121.

The fixing member 4 includes a body portion 40 and a pair of L shaped slot 401 on two ends thereof and a pair of through holes 402 penetrating the body portion 40 of the fixing member 4.

Figure 2:
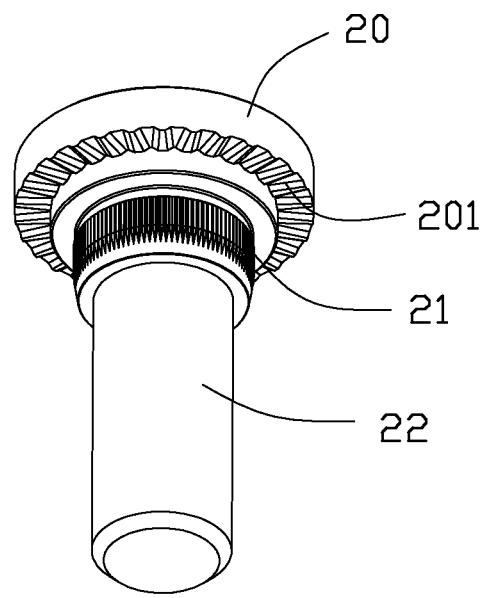
FIG. 2 is an isometric view of the screwing member as shown in FIG. 1.

Referring to FIG. 2, the screwing member 2 includes a head portion 20, an assembling portion 21 extending downwardly from the head portion 20 and a matching portion 22 extending downwardly from the assembling portion 21. The head portion 20 defines a plurality of tooth portions 201.

Referring to FIGS. 4-6, after the electrical connector 100 is assembled to the PCB 7, the fixing member 4 locates on a side of the insulating housing 5, the pivotal portions 13 of the load plate 1 are received in the slots 401 of the fixing member 4, the fastening members 3 go through the through holes 402 of the fixing member 4 and screw with a back plate 9 assembled under the PCB 7, the fastening members 3 press on the pivotal portions 13 of the load plate 1 to position the load pale 1. The ring 6 is assembled to the assembling portion 21 of the screwing member 2 for limiting the screwing member 2 on the load plate 1 and there is a space between the tongue portion 12 of the load plate 1 and the ring 6. The ring 6 interferences with the assembling portion 21 of the screwing member 2.

Referring to FIG. 5 after the package 8 is assembled to the insulating housing 5, rotate the load plate 1 to a closed position, due to the limitation of the package 8, the tongue portion 12 of the load plate 1 is in an inclined position, one end the tongue portion 12 touches with the head portion 20 of the screwing member 2, the opposite end does not touch with the head portion 20. Rotate the screwing member 2 to make it be screwed with the back plate 9, during this process, the screwing member 2 presses on the load plate 1 to make it move downwardly and until the tongue portion 12 is in a horizontal position as shown in FIG. 6. At this state, when continually rotate the screwing member 2, the tooth portions 201 will touch with the block 1210 of the load plate 1 to make a sound to cue the operator that the load plate 1 is screwed to its correct position.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector for mounting on a printed circuit board (PCB), comprising:
    an insulating housing;
    a plurality of contacts received in the insulating housing;
    a load plate covering on the insulating housing and being able to rotate between a closed position and an opened position; and
    a screwing member assembled to the load plate and used to keep the load plate in the closed position; wherein
    the screwing member has a head portion with a plurality of tooth portions, the load plate has a tongue portion, the tongue portion has a fixing hole for the screwing member going through, a recess near the fixing hole and a block in the recess, during the process of screwing the screwing member, the tooth portions touch with the block for making a sound.

2. The electrical connector as claimed in claim 1, wherein the screwing member has an assembling portion extending downwardly from the head portion and a matching portion extending downwardly from the assembling portion.

3. The electrical connector as claimed in claim 2, wherein further comprising a ring assembled to the assembling portion of the screwing member to limit the screwing member on the load plate, there is a space between the tongue portion of the load plate and the ring.

4. The electrical connector as claimed in claim 3, wherein the ring interferences with the assembling portion of the screwing member.

5. The electrical connector as claimed in claim 1, wherein further comprising a fixing member locating on a side of the insulating housing to position the load plate.

6. The electrical connector as claimed in claim 1, wherein the fixing member has a body portion and a pair of slots on two ends thereof and a pair of through holes penetrating the body portion of the fixing member.

7. The electrical connector as claimed in claim 6, wherein the load plate has a main portion and a pair of pivotal portions extending toward each other from the ends of the main portion, the tongue portion extends from the other end of the main portion.

8. The electrical connector as claimed in claim 7, wherein the pivotal portions of the load plate are received in the slots of the fixing member, the electrical connector further comprises a pair of fastening members going through the through holes of the fixing member to position the load plate.

9. An electrical connector for mounting a package to a printed circuit board (PCB), comprising:
    an insulating housing;
    a plurality of contacts received in the insulating housing;
    a load plate covering on the insulating housing and rotating between a closed position and an opened position, the load plate having a tongue portion with a block;
    a screwing member assembled to the tongue portion of the load plate and for keeping the load plate in the closed position; and
    a ring assembled to the screwing member for limiting the screwing member on the load plate; wherein
    the screwing member has a head portion with a plurality of tooth portions, when the package is assembled to the insulating housing and the load plate is naturally presses on the package, the tongue portion of the load plate is in an inclined position, one end of the tongue portion touches with the head portion of the screwing member, and the opposite end of the tongue portion does not touch with the head portion, and when the tongue portion is in a horizontal position and continually rotate the screwing member, the tooth portions will touch with the block of the load plate for making a sound.

10. The electrical connector as claimed in claim 9, wherein the tongue portion has a fixing hole for going through of the screwing member, and a recess near the fixing hole, the block is set in the recess.

11. The electrical connector as claimed in claim 9, wherein the screwing member has an assembling portion extending downwardly from the head portion and a matching portion extending downwardly from the assembling portion, the ring is assembled to the assembling portion of the screwing member.

12. An electrical connector for mounting on a printed circuit board (PCB), comprising:
    an insulating housing;
    a plurality of contacts received in the insulating housing;
    a load plate positioned above the insulating housing and defining opposite front and rear ends, said load plate rotatable about the rear end and between a closed position and an opened position; and
    a screwing member assembled to the front end of the load and having a head portion with a plurality of teeth thereunder; wherein
    a front end region of the load plate forms a fixing hole through which the screwing member extends, and an upward protrusion is located around the fixing hole at a radial position, with regard to said fixing hole, which is farthest from a front edge of said front end, so as to engage the corresponding tooth and make a sound when the load plate is rotated to closed position and the screwing member is downwardly moved to a locking position.

13. The electrical connector as claimed in claim 12, wherein said fixing hole is a complete round hole.

14. The electrical connector as claimed in claim 12, wherein said front end region forms a recess around the fixing hole, and said upward protrusion is located in the recess.

\* \* \* \* \*